United States Patent
Tian et al.

(10) Patent No.: US 11,380,715 B2
(45) Date of Patent: Jul. 5, 2022

(54) DISPLAY SUBSTRATE, DISPLAY PANEL, DISPLAY APPARATUS, AND METHOD OF FABRICATING DISPLAY SUBSTRATE

(71) Applicant: BOE Technology Group Co., Ltd., Beijing (CN)

(72) Inventors: Hongwei Tian, Beijing (CN); Yanan Niu, Beijing (CN); Chunyang Wang, Beijing (CN); Dong Li, Beijing (CN); Zheng Liu, Beijing (CN); Shuai Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/493,096

(22) PCT Filed: Mar. 21, 2019

(86) PCT No.: PCT/CN2019/079016
§ 371 (c)(1),
(2) Date: Sep. 11, 2019

(87) PCT Pub. No.: WO2020/077948
PCT Pub. Date: Apr. 23, 2020

(65) Prior Publication Data
US 2021/0384224 A1 Dec. 9, 2021

(30) Foreign Application Priority Data

Oct. 15, 2018 (CN) .......................... 201811194732.3

(51) Int. Cl.
*H01L 27/12* (2006.01)
(52) U.S. Cl.
CPC ........ *H01L 27/124* (2013.01); *H01L 27/1262* (2013.01)

(58) Field of Classification Search
CPC ............. H01L 27/124; H01L 29/78633; H01L 27/1288; H01L 27/1222; H01L 27/127
See application file for complete search history.

(56) References Cited

U.S. PATENT DOCUMENTS

| 9,412,760 B1 * | 8/2016 | Bai ........................ H01L 27/124 |
| 2019/0073976 A1 * | 3/2019 | Yeh ........................ H01L 27/124 |
| 2019/0288056 A1 | 9/2019 | Xiao et al. |

FOREIGN PATENT DOCUMENTS

| CN | 104965368 A | 10/2015 |
| CN | 107093618 A | 8/2017 |

(Continued)

OTHER PUBLICATIONS

International Search Report & Written Opinion dated Jul. 19, 2019, regarding PCT/CN2019/079016.

*Primary Examiner* — Tony Tran
(74) *Attorney, Agent, or Firm* — Intellectual Valley Law, P.C.

(57) ABSTRACT

A display substrate having a display area and a gate-on-array (GOA) area outside the display area is provided. The display substrate includes a base substrate; a light shielding layer on the base substrate; an insulating layer on a side of the light shielding layer away from the base substrate; and a GOA signal line on a side of the insulating layer away from the light shielding layer, and is connected electrically in parallel with a first part of the light shielding layer, the first part being in the GOA area. The display substrate includes a plurality of first vias extending through the insulating layer in the GOA area. The GOA signal line is electrically connected to the first part of the light shielding layer through the plurality of first vias respectively, thereby connecting the GOA signal line and the first part of the light shielding layer electrically in parallel.

14 Claims, 6 Drawing Sheets

(56) References Cited

FOREIGN PATENT DOCUMENTS

| | | |
|---|---|---|
| CN | 107121852 A | 9/2017 |
| CN | 107623023 A | 1/2018 |

\* cited by examiner

DISPLAY SUBSTRATE, DISPLAY PANEL, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2019/079016, filed Mar. 21, 2019, which claims priority to Chinese Patent Application No. 201811194732.3, filed Oct. 15, 2018, the contents of which are incorporated by reference in the entirety.

TECHNICAL FIELD

The present invention relates to display technology, more particularly, to a display substrate, a display panel, a display apparatus, and a method of fabricating a display substrate thereof.

BACKGROUND

The organic light-emitting diode display (OLED) is an important technology in display industry. The organic light-emitting diode display has the advantages of low power consumption, high color saturation, wide viewing angle, thin thickness, and high flexibility. The OLED technology has been widely used in a smart phone, a tablet computer, or a television, especially in fabricating a flexible display device.

As the resolution of a display panel increases (e.g., in Full High Definition (FHD), Quarter High Definition (QHD)), the density of the integrated circuits increases correspondingly, therefore, it becomes more and more difficult to accommodate the more and more complicated integrated circuits in the margins of a display panel. Accordingly, the double-source/drain-layer technology has been used to reduce the margin of a display panel.

SUMMARY

In one aspect, the present invention provides a display substrate having a display area and a gate-on-array (GOA) area outside the display area, comprising a base substrate; a light shielding layer on the base substrate; an insulating layer on a side of the light shielding layer away from the base substrate; a GOA signal line on a side of the insulating layer away from the light shielding layer, and is connected electrically in parallel with a first part of the light shielding layer, the first part being in the GOA area; wherein the display substrate comprises a plurality of first vias extending through the insulating layer in the GOA area; and the GOA signal line is electrically connected to the first part of the light shielding layer through the plurality of first vias respectively, thereby connecting the GOA signal line and the first part of the light shielding layer electrically in parallel.

Optionally, the display substrate further comprises a plurality of thin film transistors in the display area; wherein the light shielding layer further comprises a plurality of light shielding blocks on the base substrate, and in the display area, a respective one of the plurality of light shielding blocks on a side of an active, layer of the plurality of thin film transistors closer to the base substrate for shielding light from irradiating on the active layer; and the first part of the light shielding layer and the plurality of light shielding blocks are in a same layer and comprise a same material.

Optionally, the display substrate further comprises a planarization layer on a side of the GOA signal line away from the base substrate; and a first signal line in the GOA area and on a side of the planarization layer away from the base substrate, and is connected electrically in parallel with a second part of the light shielding layer in the GOA area, the second part spaced apart from the first part; wherein the display substrate comprises a plurality of second vias extending through the insulating layer and the planarization layer in the GOA area; and the first signal line is electrically connected to the second part of the light shielding layer through the plurality of second vias respectively, thereby connecting the first signal line and the second part of the light shielding layer electrically in parallel.

Optionally, the display substrate comprises at least one opening in the second part of the light shielding layer.

Optionally, the first part and the second part of the light shielding layer, and the plurality of light shielding blocks are in a same layer and comprise a same material.

Optionally, the display substrate further comprises a second signal line in the display area and on a side of the planarization layer away from the base substrate, and is connected electrically in parallel with a third part of the light shielding layer in the display area, the third part spaced apart from the first part and spaced apart from the second part; and a plurality of third vias extending through the insulating layer and the planarization layer in the display area; wherein the second signal line is electrically connected to the third part of the light shielding layer through the plurality of third vias respectively, thereby connecting the second signal line and the third part of the light shielding layer electrically in parallel.

Optionally, the first part, the second part, and the third part of the light shielding layer, and the plurality of light shielding blocks are in a same layer and comprise a same material.

Optionally, an orthographic projection of the respective one of the plurality of light shielding blocks on the base substrate covers an orthographic projection of the active layer of the plurality of thin film transistors on the base substrate.

Optionally, the display substrate further comprises an opening in the respective one of the plurality of light shielding blocks allowing light passing through to a photosensor for fingerprint detection.

Optionally, the GOA signal line is selected from a group consisting of a clock signal line, a high voltage power line, and a low voltage power line.

Optionally, the first signal line is a power signal line.

Optionally, the second signal line is a ground voltage line.

Optionally, the display substrate comprises at least one opening in the first part of the light shielding layer.

In another aspect, the present invention provides a display panel, comprising the display substrate described herein or fabricated by a method described herein, and one or more integrated circuits connected to the display substrate.

In another aspect, the present invention provides a display apparatus, comprising the display panel described herein.

In another aspect, the present invention provides a method of fabricating a display substrate having a display area and a gate-on-array (GOA) area outside the display area, comprising forming a light shielding layer on a base substrate forming an insulating layer on a side of the light shielding layer away from the base substrate; forming a GOA signal line on a side of the insulating layer away from the light shielding layer, the GOA signal line formed to be connected electrically in parallel with a first part of the light shielding layer, the first part being in the GOA area; and forming a plurality of first vias extending through the insulating layer in the GOA area; wherein the GOA signal line is electrically connected to the first part of the light shielding layer through the plurality of first vias respectively, thereby connecting the GOA signal line and the first part of the light shielding layer electrically in parallel.

Optionally, the method further comprises forming a plurality of thin film transistors in the display area; wherein forming the light shielding layer further comprises forming a plurality of light shielding blocks on the base substrate and in the display area, a respective one of the plurality of light shielding blocks formed on a side of an active layer of the plurality of thin film transistors closer to the base substrate for shielding light from irradiating on the active layer; and the first part of the light shielding layer and the plurality of light shielding blocks are formed in a same layer using a same material and a single mask plate.

Optionally, the method further comprises forming a planarization layer on a side of the GOA signal line away from the base substrate; forming a first signal line in the GOA area and on a side of the planarization layer away from the base substrate, the first signal line formed to be connected electrically in parallel with a second part of the light shielding layer in the GOA area, the second part spaced apart from the first part; and forming a plurality of second vias extending through the insulating layer and the planarization layer in the GOA area; wherein the first signal line is formed to be electrically connected to the second part of the light shielding layer through the plurality of second vias respectively, thereby connecting the first signal line and the second part of the light shielding layer electrically in parallel.

Optionally, the method further comprises forming a second signal line in the display area and on a side of the planarization layer away from the base substrate, the second signal line formed to be connected electrically in parallel with a third part of the light shielding layer in the display area, the third part spaced apart from the first part and spaced apart from the second part; and forming a plurality of third vias extending through the insulating layer and the planarization layer in the display area; wherein the second signal line is formed to be electrically connected to the third part of the light shielding layer through the plurality of third vias respectively, thereby connecting the second signal line and the third part of the light shielding layer electrically in parallel.

Optionally, the first part, the second part, and the third part of the light shielding layer, and the plurality of light shielding blocks are formed in a same layer using a same material and a single mask plate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
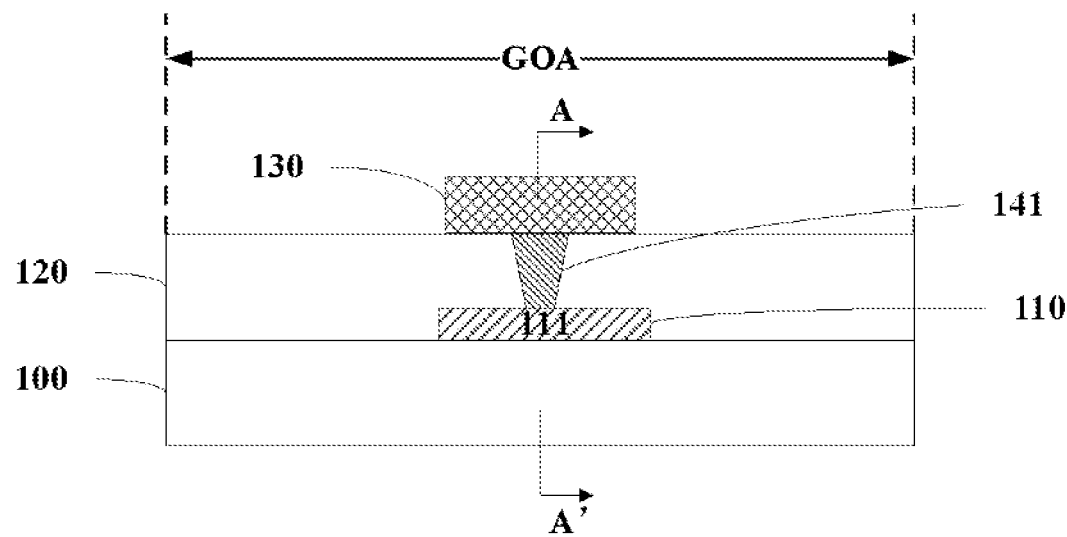
FIG. 1 is a cross-sectional view of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a display substrate, a signal line (e.g. GOA signal line) may generate heat when current go through the signal line. The present disclosure provides, inter alia, a display substrate, a display panel, a display apparatus, and a method of fabricating a display substrate thereof that substantially obviate one or more of the problems due to limitations and disadvantages of the related art. In one aspect, the present disclosure provides a display substrate having a display area and a gate-on-array (GOA) area outside the display area, Optionally, the display substrate includes a base substrate; a light shielding layer on the base substrate; an insulating layer on a side of the light shielding layer away from the base substrate; a GOA signal line on a side of the insulating layer away from the light shielding layer. Optionally, the GOA signal line is connected electrically in parallel with a first part of the light shielding layer. Optionally, the first part of the light shielding layer is in the GOA area. Optionally, the display substrate includes a plurality of first vias extending through the insulating layer in the GOA area. Optionally, the GOA signal line is electrically connected to the first part of the light shielding layer through the plurality of first vias respectively, thereby connecting the GOA signal line and the first part of the light shielding layer electrically in parallel.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding to a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal flame), can be disposed in the peripheral area rather than in the display areas.

As used herein the term "gate-on-array area" refers to an area of a display substrate e.g., an opposing substrate or an array substrate) in a display panel where a gate-on-array is provided. The gate-on-array area is in the peripheral area.

FIG. 1 is a cross-sectional view of a display substrate in some embodiments according to the present disclosure. Referring to FIG. 1, in some embodiments, a display substrate having a display area and a gate-on-array (GOA) area outside the display area, includes a base substrate 100. Optionally, the base substrate 100 is a flexible base substrate. Optionally, the base substrate 100 is a rigid base substrate.

In some embodiments, the display substrate further includes a light shielding layer 110 on the base substrate 100. Optionally, the light shielding layer 110 includes a first part 111. Optionally, the light shielding layer 110 is made of a conductive material. Various appropriate conductive materials may be used for making the light shielding layer 110. Examples of conductive materials suitable for making the light shielding layer 110 include, but are not limited to various metals, and various alloys.

In some embodiments, the display substrate further includes an insulating layer 120 on a side of the light shielding layer 110 away from the base substrate 100. Various appropriate materials may be used for forming the insulating layer 120. Examples of materials suitable for forming the insulating layer 120 includes, but are not limited to, silicon oxide, and silicon nitride.

In some embodiments, the display substrate further includes a signal line on a side of the insulating layer 120 away from the light shielding layer 110. Optionally, the signal line is a GOA signal line 130. Optionally, the GOA signal line 130 is connected electrically in parallel with the first part 111 of the light shielding layer 110. Optionally, the first part 111 of the light shielding layer 110 is in the GOA area.

In some embodiments, the display substrate includes a plurality of first vias 141 extending through the insulating layer 120 in the GOA area. Optionally, the GOA signal line 130 is electrically connected to the first part 111 of the light shielding layer 110 through the plurality of first vias 141, respectively, to connect the GOA signal line 130 and the first part 111 of the light shielding layer 110 electrically in parallel. By electrically connecting the GOA signal line 30 in parallel with the first part 111 of the light shielding layer 110, the resistance of a combination of the GOA signal line 30 and the first part 111 of the light shielding layer 110 is less than a sum of a resistance of the GOA signal line 130 and a resistance of the first part 111 of the light shielding layer 110.

Figure 2:
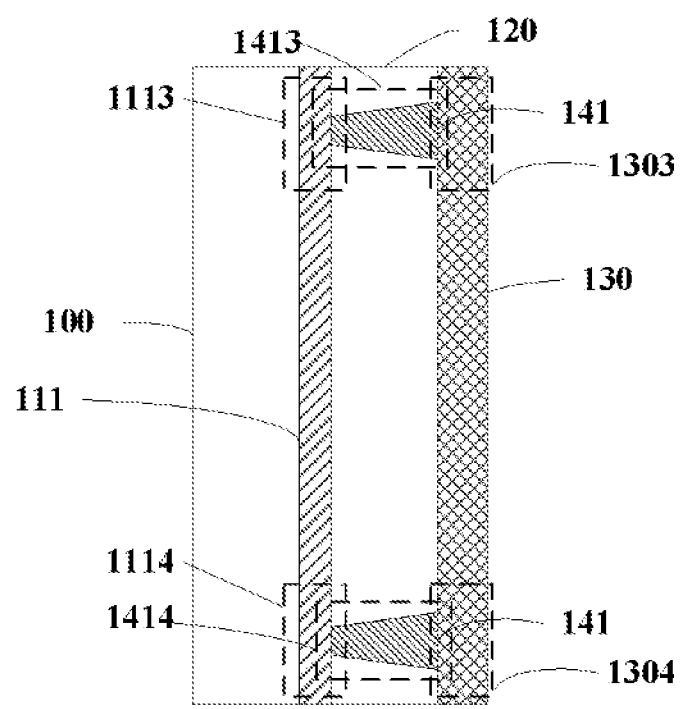
FIG. 2 is a cross-sectional view of the display substrate along line A-A' in FIG. 1.

FIG. 2 is a cross-sectional view of the display substrate along line A-A' in FIG. 1. Referring to FIG. 2, the display substrate includes a plurality of first vias 141 extending through the insulating layer 120. FIG. 2 shows two vias of the plurality of first vias 141. Optionally, a conductive material is filled into the plurality of first, vias 141. For example, the conductive material filled in the plurality of first vias 141 is a metallic material.

Optionally, the GOA signal line 130 is electrically connected to the first part 111 of the light shielding layer 110 through at least two vias of the plurality of first vias 141 to connect the GOA signal line 130 and the first part 111 of the light shielding layer 110 electrically in parallel. Optionally, one portion of the GOA signal line 130 is electrically connected to one portion of the first part 111 of the light shielding layer 110, another portion of the GOA signal line 130 is electrically connected to another portion of the first part 111 of the light shielding layer 110.

For example, a first portion 1303 of the GOA signal line 130 is electrically connected to a second portion 1113 of first part 111 of the light shielding layer 110 through a first via 1413 of the plurality of first vias 141 to connect the GOA signal line 130 and the first part 111 of the light shielding layer 110 electrically in parallel. A third portion 1304 of the GOA signal line 130 is electrically connected to a fourth portion 1114 of the first part 111 of the light shielding layer 110 through a second via 1414 of the plurality of first visas 141 to connect the GOA signal line 130 and the first part 111 of the light shielding layer 110 electrically in parallel.

Optionally, the number of the plurality of first vias 141 is more than two. Optionally, in order for the GOA signal line 130 and the first part 111 of the light shielding layer 110 electrically connecting in parallel with each other, three or more vias of the plurality of first visas 141 are provided for the GOA signal line 130 and the first part 11 of the light shielding layer 110 electrically connecting in parallel with each other.

In some embodiments, the GOA signal line 130 is selected from a group consisting of a clock signal line, a high voltage power line, and a low voltage power line.

Figure 3:
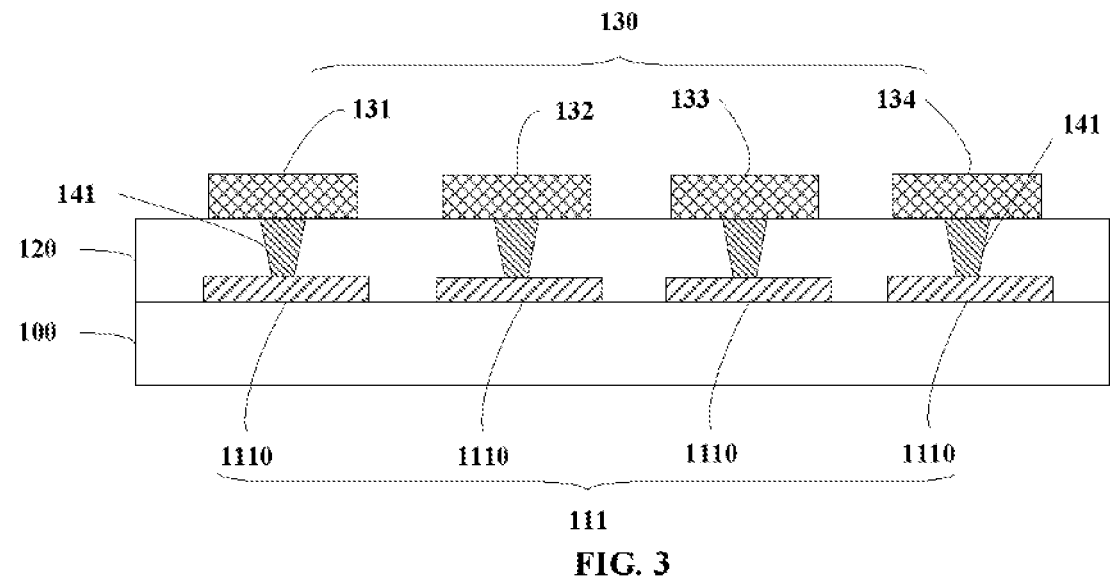
FIG. 3 is a cross-sectional view of a display substrate in some embodiments according to the present disclosure.

FIG. 3 is a cross-sectional view of a display substrate in some embodiments according to the present disclosure. Referring to FIG. 3, in some embodiments, the GOA signal line 130 includes a first clock signal line 131, a second clock signal line 132, a high voltage power line 133, and a low voltage power line 134. The first part 111 of the light shielding layer 110 includes a plurality of first blocks 1110. In one example, a respective one of the plurality of first blocks 1110 of the light shielding layer 110 may be connected electrically in parallel with the first clock signal line 131. In another example, a respective one of the plurality of first blocks 1110 of the light shielding layer 110 may be connected electrically in parallel with the second clock signal line 132. In another example, a respective one of the plurality of first blocks 1110 of the light shielding layer 110 may be connected electrically in parallel with the high voltage power line 133. In another example, a respective one of the plurality of first blocks 1110 of the light shielding layer 110 may be connected electrically in parallel with the low voltage power line 134.

For example, the first clock signal line 131 is connected electrically in parallel with a respect one of the plurality of first blocks 1110 of the light shielding layer 110 through at least two vias of the plurality of first vias 141. The second clock signal line 132 is electrically connected in parallel with a respect one of the plurality of first blocks 1110 of the light shielding layer 110 through at least two vias of the plurality of first vias 141. The high voltage power line 133 is electrically connected in parallel with a respect one of the plurality of first blocks 1110 of the light shielding layer 110 through at least two vias of the plurality of first vias 141. The low voltage power line 134 is electrically connected in parallel with a respect one of the plurality of first blocks 1110 of the light shielding layer 110 through at least two vias of the plurality of first vias 141.

By electrically connecting the first clock signal line 131 in parallel with the first part 111 of the light shielding layer 110, the resistance of a combination of the first clock signal line 131 and the first part 111 of the light shielding layer 110 is less than a sum of a resistance of the first clock signal line 131 and the first part 111 of the light shielding layer 110.

By electrically connecting the second clock signal line 132 in parallel with the first part 111 of the light shielding layer 110, the resistance of a combination of the second clock signal line 132 and the first part 111 of the light shielding layer 110 is less than a sum of a resistance of the second clock signal line 132 and the first part 111 of the light shielding layer 110.

By electrically connecting the high voltage power line 133 in parallel with the first part 111 of the light shielding layer 110, the resistance of a combination of the high voltage power line 133 and the first part 111 of the light shielding layer 110 is less than a sum of a resistance of the high voltage power line 133 and the first part 111 of the light shielding layer 110.

By electrically connecting the low voltage power line 134 in parallel with the first part 111 of the light shielding layer 110, the resistance of a combination of the low voltage power line 134 and the first part 111 of the light shielding layer 110 is less than a sum of a resistance of the low voltage power line 134 and the first part 111 of the light shielding layer 110.

Figure 4:
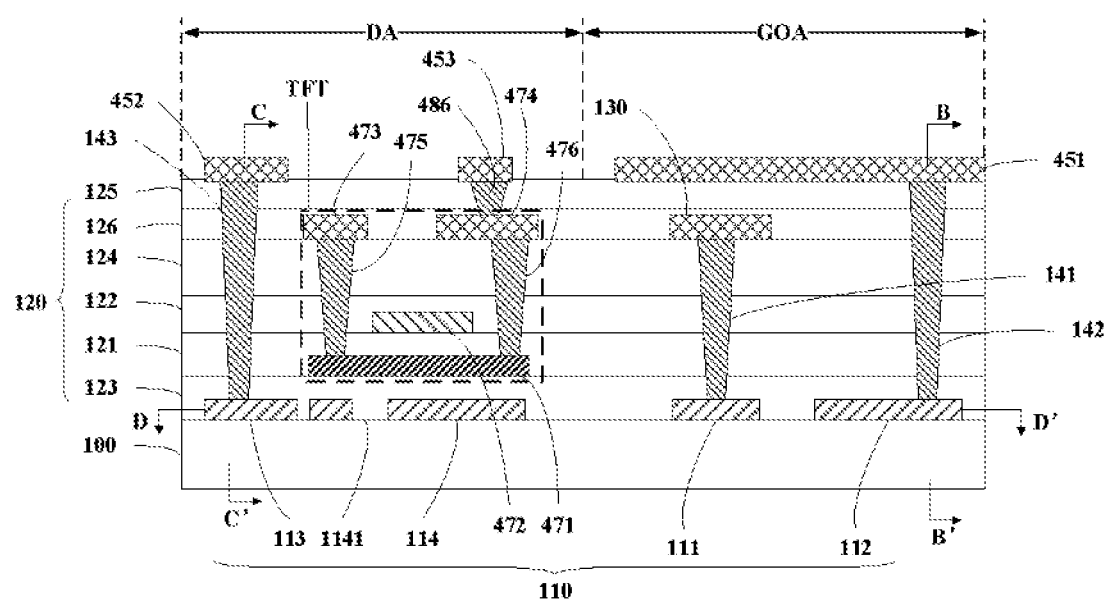
FIG. 4 is a cross-sectional view of a display substrate in some embodiments according to the present disclosure.

FIG. 4 is a cross-sectional view of a display substrate in some embodiments according to the present disclosure. Referring to FIG. 4, in some embodiments, the display substrate includes a base substrate 100, a light shielding layer 110, an insulating layer 120, and a GOA signal line 130. Optionally, the GOA signal line 130 is connected electrically in parallel with a first part 111 of the light shielding layer 110 through at least two vias of the plurality of first vias 141.

In some embodiments, the light shielding layer 110 further includes a second part 112.

In some embodiments, the insulating layer 120 includes a planarization layer 125 on a side of the GOA signal line 130 away from the base substrate 100. In one example, the planarization layer 125 is in direct contact with the GOA signal line 130. In another example, the insulating layer 120 may further include a passivation layer 126 between the GOA signal line 130 and the planarization layer 125.

Various appropriate materials may be used for making the planarization layer 125. Examples of materials suitable for forming the planarization layer 125 include, but are not limited to, silicon oxide, silicon nitride, and silicon oxynitride.

Various appropriate materials may be used for forming the passivation layer 126. Examples of materials suitable for forming the passivation layer 126 include, but are not limited to, silicon oxide, silicon nitride, and silicon oxynitride.

In some embodiments, the signal line includes a first signal line 451 on a side of the planarization layer 125 away from the GOA signal line 130. Optionally, the first signal line 451 is in direct contact with the planarization layer 125.

In some embodiments, the first signal line 451 is in the GOA area. Optionally, the first signal line 451 is connected electrically in parallel with the second part 112 of the light shielding layer 110 in the GOA area. Optionally, the second part 112 is spaced apart from the first part 111. Optionally, the first signal line 451 is a power signal line (Vss).

In some embodiments, the display substrate includes a plurality of second vias 142 extending through the insulating layer 120 its the GOA area. Optionally, the first signal line 451 is electrically connected to the second part 112 of the light shielding layer 110 through the plurality of second vias 142 respectively to connect the first signal line 451 and the second part 112 of the light shielding layer 110 electrically in parallel.

In one example, a relatively larger resistance of the first signal line 451 may lead to a relatively larger IR-Drop, and a larger IR-Drop may cause the problem of uneven display. By electrically connecting the first signal line 451 in parallel with the second part 112 of the light shielding layer 110, the resistance of a combination of the first signal line 451 and the second part of the light shielding layer 110 is less than a sum of a resistance of the first signal line 451 and s resistance of the second part 112 of the light shielding layer 110. A lower resistance of the combination of the first signal line 451 and the second part of the light shielding layer 110 decreases the IR-Drop and improves the display uniformity.

In some embodiments, the light shielding layer 110 further includes a third part 113 of the light shielding layer 110. Optionally, the third part 113 is spaced apart from both the first part 111 and the second part 112.

In some embodiments, the signal line includes a second signal line 452 on a side of the planarization layer 125 away from the GOA signal line 130. Optionally, the second signal line 452 is in the display area DA. Optionally, the second signal line 452 is connected electrically in parallel with the third part 113 of the light shielding layer in the display area DA. Optionally, the second signal line 452 is in direct contact with the planarization layer 125. Optionally, the second signal line 452 is a ground voltage line.

In some embodiments, the display substrate includes a plurality of third vias 143 extending through the insulating layer 120 and the planarization layer 125 in the display area DA. Optionally, the second signal line 452 is electrically connected to the third part 113 of the light shielding layer 110 through the plurality of third vias 143 respectively, to connect the second signal line 452 and the third part 113 of the light shielding layer 110 electrically in parallel.

By electrically connecting the second signal line 452 in parallel with the third part 113 of the light shielding layer 110, a resistance of a combination of the second signal line 452 and the light shielding layer 110 is less than a sum of a resistance of the second signal line 452 and a resistance of the third part 113 of the light shielding layer 110.

In some embodiments, the insulating layer 120 further include a buffer layer 123 on a side of the light shielding layer 110 away from the base substrate 100.

Various appropriate materials may be used for making the insulating layer 120. Examples of materials suitable for making the insulating layer 120 include, but are not limited to, silicon oxide, and silicon nitride.

In some embodiments, the insulating layer 120 further includes a first insulating layer 121 on a side of the buffer layer 123 away from the base substrate 100. Optionally, the first insulating layer 121 is in direct contact with the buffer layer 123.

Various appropriate materials may be used for making the first insulating layer 121. Examples of materials suitable for making the first insulating layer 121 include, but are not limited to, silicon oxide, and silicon nitride.

In some embodiments, the insulating layer 120 further includes a second insulating layer 122 on a side of the first insulating layer 121 away from the base substrate 100. Optionally, the second insulating layer 122 is in direct contact with the first insulating layer 121.

Various appropriate materials may be used for making the second insulating layer 122. Examples of materials suitable for making the second insulating layer 122 include, but are not limited to, silicon oxide, and silicon nitride.

In some embodiments, the insulating layer 120 further include an inter-layer dielectric layer 124 on a side of the second insulating layer 122 away from the base substrate 100. Optionally, the inter-layer dielectric layer 124 is in direct contact with the second insulating layer 122.

Various appropriate materials may be used for making, the inter-layer dielectric layer 124. Examples of materials suitable for making the inter-layer dielectric layer 124 include, but are not limited to, silicon oxide, and silicon nitride.

In some embodiments, the GOA signal line 130 is on a side of the inter-layer dielectric layer 124 away from the base substrate 100. Optionally, the GOA signal line 130 is in direct contact with the inter-layer dielectric layer 124.

In some embodiments, the plurality of first vias 141 extend through the buffer layer 123, the first insulating layer 121, the second insulating layer 122, and the inter-layer dielectric layer 124.

In some embodiments, the insulating layer 120 includes a planarization layer 125 on a side of the inter-layer dielectric layer 124 away from the base substrate 100.

In some embodiments, the display substrate includes an active layer 471 between the buffer layer 123 and the first insulating layer 121. Optionally, the active layer 471 includes a semiconductor layer, e.g. a polysilicon layer.

In some embodiments, the display substrate includes a gate electrode 472 between the first insulating layer 121 and the second insulating layer 122.

In some embodiments, the display substrate includes a source electrode 473, and a drain electrode 474, on a side of the inter-layer dielectric: layer 124 away from the base substrate 100. Optionally, the source electrode 473 is in direct contact with the inter-layer dielectric layer 124, and the drain electrode 474 is in direct contact with the inter-layer dielectric layer 124. Optionally, the source electrode 473, the drain electrode 474, and the GOA signal line 130 are formed in a same layer. Optionally, the source electrode 473 is spaced apart from the GOA signal line 130, and the drain electrode 474 is spaced apart from the GOA signal line 130.

In some embodiments, the display substrate includes a plurality of fourth vias 475 extending through the first insulating layer 121, the second insulating layer 122, and the inter-layer dielectric layer 124. In some embodiments, the display substrate includes a plurality of fifth vias 476 extending through the first insulating layer 121, the second insulating layer 122, and the inter-layer dielectric layer 124.

Optionally, a conductive material is filled the plurality of fourth vias 475. Optionally, a conductive materials is filled in the plurality of fifth vias 476. For example, the conductive material is a metallic material.

Optionally, the source electrode 473 is electrically connected to the active layer 471 through one of the plurality of fourth vias 475. Optionally, the drain electrode 474 is electrically connected to the active layer 471 through one of the plurality of fifth vias 476.

In some embodiments, the display substrate includes a plurality of thin film transistors TFT in display area DA. A respective one of the plurality of thin film transistors TFT includes, but is not limited to, the active layer 471, the gate electrode 472, the source electrode 473, the drain electrode 474, one of the plurality of fourth vias 475, and one of the plurality of fifth vias 476.

Optionally, the respective one of the plurality of thin film transistors TFT further includes a portion of the first insulating layer 121. For example, the portion of the first insulating layer 121 is between the active layer 471 and the gate electrode 472. An orthographic projection of the portion of the first insulating layer 121 on the base substrate 100 covers an orthographic projection of the respective one of the plurality of thin film transistors TFT on the base substrate 100.

Optionally, the respective one of the plurality of thin film transistors TFT further includes a portion of the second insulating layer 122. For example, the portion of the second insulating layer 122 is between the gate electrode 472, and the source and drain electrodes. An orthographic projection of the portion of the second insulating layer 122 on the base substrate 100 covers the orthographic projection of the respective one of the plurality of thin film transistors TFT on the base substrate 100.

Optionally, the respective one of the plurality of thin film transistors TFT further includes a portion of the inter-level dielectric (ILD) layer. For example, the portion of the inter-layer dielectric layer 124 is between the gate electrode 472, and the source and drain electrodes. An orthographic projection of the portion of the inter-layer dielectric layer 124 on the base substrate 100 covers the orthographic projection of the respective one of the plurality of thin film transistors TFT on the base substrate 100.

In some embodiments, the signal line is a third signal line 453 on a side of the planarization layer 125. Optionally, the third signal line 453 is a power source voltage line. The third signal line 453 is electrically connected to the drain electrode 474 through one of a plurality of sixth vias 486.

In some embodiments, the light shielding layer 110 includes the first part 111, the second part 112, the third part 113 and the plurality of light shielding blocks 114. Optionally, the first part 111 of the light shielding layer 110 and the plurality of light shielding blocks 114 are in a same layer and includes a same material. Optionally, the first part 111 and the second part 112 of the light shielding layer 110, and the plurality of light shielding blocks 114 are in a same layer and includes a same material. Optionally, the first part, the second part, and the third part of the light shielding layer, and the plurality of light shielding blocks are in a same layer and include a same material.

Optionally, the plurality of light shielding blocks 114 is on the base substrate 100. Optionally, the plurality of light shielding blocks 114 is in the display area DA. Optionally, a respective one of the plurality of light shielding blocks 114 is on a side of the active layer 471 of the plurality of thin film transistors TFT closer to the base substrate 100 for shielding light from irradiating on the active layer 471. For example, a respective one of the plurality of light shielding blocks 114 is corresponding to an active layer 471 of one of the plurality of thin film transistors 111.

Optionally, an orthographic projection of the respective one of the plurality of light shielding blocks 114 on the base substrate 100 covers an orthographic projection of the active layer 471 of the plurality of thin film transistors TFT on the base substrate 100.

Optionally, an opening 1141 is in the respective one of the plurality of light shielding blocks 114 allowing light passing through to a photosensor for fingerprint detection.

Optionally, a constant voltage (e.g. ground voltage) is applied to the plurality of light shielding blocks 114 of the light shielding layer 110, which may reduce the floating body effect of the plurality of thin film transistors TFT corresponding to the plurality of light shielding blocks 114.

Figure 5:
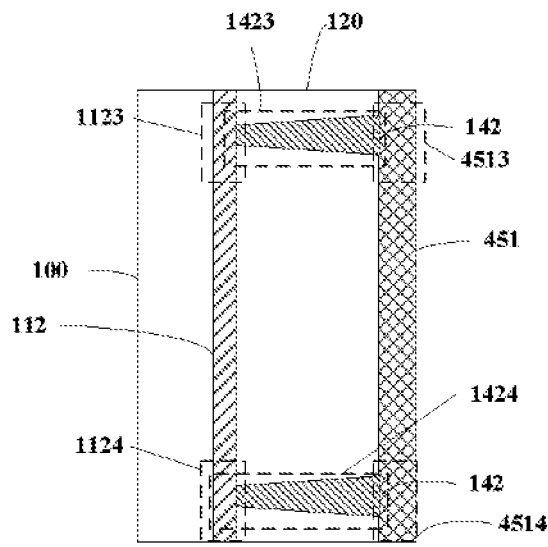
FIG. 5 is a cross-sectional view of the display substrate along line B-B' in FIG. 4.

FIG. 5 is a cross-sectional view of the display substrate along line B-B' in FIG. 4. The FIG. 5 shows two vias of the plurality of second vias 142. Optionally, the two vias of the plurality of second vias 142 is filed with a conductive material (e.g. metallic material). Referring to both FIG. 4 and FIG. 5, optionally, the insulating layer 120 includes the buffer layer 123, the first insulating layer 121, the second insulating layer 122, the inter-layer dielectric layer 124, and a planarization layer 125.

In some embodiments, the second part 112 of the light shielding layer 110 is electrically connected in parallel with the first signal line 451 through at least two vias of the plurality of second vias 142. Optionally, one portion of the first signal line 451 is electrically connected to one portion of the second part 112 of the light shielding layer 110, another portion of the first signal line 451 is electrically connected to another portion of the second part 112 of the light shielding layer 110.

For example, a fifth portion 4513 of the first signal line 451 is electrically connected to a sixth portion 1123 of the second part 112 of the light shielding layer 110 through a third via 1423 of the plurality of second vias 142 to connect the first signal line 451 and the second part 112 of the light shielding layer 110 electrically in parallel. A seventh portion 4514 of the first signal line 451 is electrically connected to a eighth portion 1124 of the second part 112 of the light shielding layer 110 through a fourth via 1424 of the plurality of second vias 142 to connect the first signal line 451 and the second part 112 of the light shielding layer 110 electrically in parallel.

Optionally, the amount of the plurality of second vias 142 is more than two. Optionally, three or more vias of the plurality of second vias 142 may be provided for the first signal line 451 electrically connected in parallel with the second part 112 of the light shielding layer 110.

Figure 6:
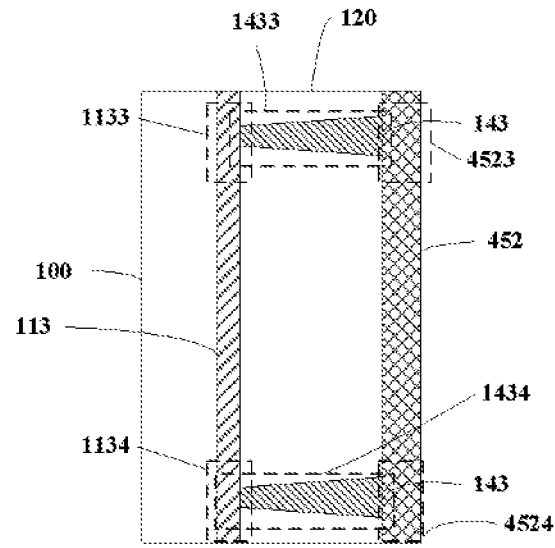
FIG. 6 is a cross-sectional view of the display substrate along line C-C' in FIG. 4.

FIG. 6 is a cross-sectional view of the display substrate along line C-C' in FIG. 4. FIG. 6 shows two vias of the plurality of third vias 143. Optionally, the two vias of the plurality of third vias 143 is filed with a conductive material (e.g. metallic material). Referring to both FIG. 4 and FIG. 6, optionally, the insulating layer 120 includes the buffer layer 123, the first insulating layer 121, the second insulating layer 122, the inter-layer dielectric layer 124, and a planarization layer 125.

In some embodiments, the third part 113 of the light shielding layer 110 is electrically connected in parallel with the second signal line 452 through at least two vias of the plurality of third vias 143. Optionally, one portion of the second signal line 452 is electrically connected to one portion of the third part 113 of the light shielding layer 110, another portion of the second signal line 452 is electrically connected to another portion of the third part 113 of the light shielding layer 110.

For example, a ninth portion 4523 of the second signal line 452 is electrically connected to a tenth portion 1133 of the third part 113 of the light shielding layer 110 through a fifth via 1433 of the plurality of third vias 143 to connect the second signal line 452 and the third part 113 of the light shielding layer 110 electrically in parallel. An eleventh portion 4524 of the second signal line 452 is electrically connected to a twelfth portion 1134 of the third part 113 of the light shielding layer 110 through a sixth via 1434 of the plurality of third vias 143 to connect the second signal line 452 and the third part 113 of the light shielding layer 110 electrically in parallel.

Optionally, the amount of the plurality of third vias 143 is more than two. Optionally, three or more vias of the plurality of third vias 143 may be provided for the second signal line 452 electrically connected in parallel with the third part 113 of the light shielding layer 110.

Figure 7:
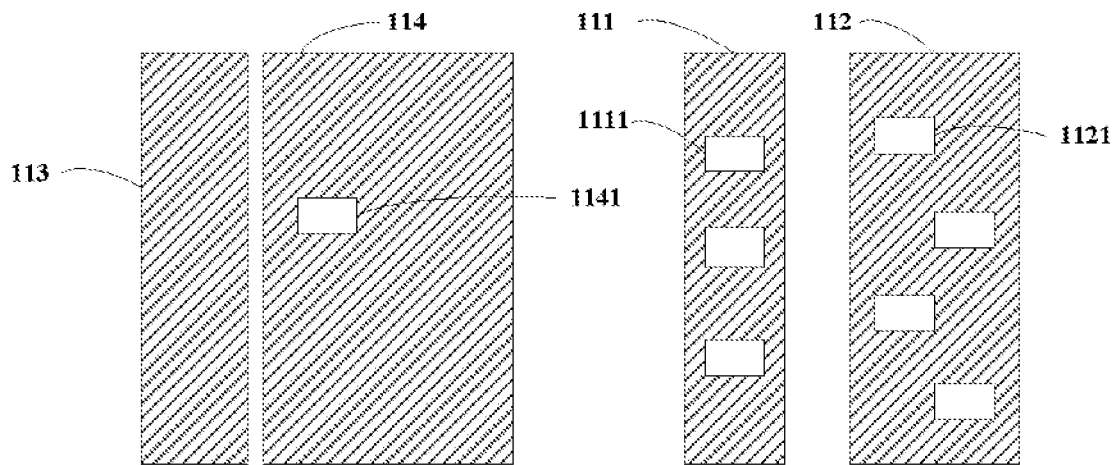
FIG. 7 is a cross-sectional view of the display substrate along line D-D' in FIG. 4.

FIG. 7 is a cross-sectional view of the display substrate along line D-D' in FIG. 4. The FIG. 7 shows the first part 111 of the light shielding layer 110, the second part 112 of the light shielding layer 110, the third part 113 of the light shielding layer 110, and the plurality of light shielding blocks 114 of the light shielding layer 110. Optionally, an opening 1141 is in the respective one of the plurality of light shielding blocks 114 allowing light passing through to a photosensor for fingerprint detection.

In some embodiments, at least one opening 1111 is in the first part 111 of the light shielding layer 110. Having at least one opening 1111 in the first part 111 may reduce the area of the light shielding layer 110 facing the GOA signal line, and may reduce the adversary effect the light shielding layer 110 have on the GOA signal line. For example, having at least one opening 1111 in the first part 111 may reduce the overlapping area between an orthographic projection of the light shielding layer on the base substrate and an orthographic projection of the GOA signal line on the base substrate. Optionally, the ratio of the opening area of at least one opening 1111 to the area of the first part 111 is in a range of 0.5% to 60%, e.g. 0.5% to 10%, 10% to 20%, 20% to 10%, 10% to 40%, 40% to 50%, and 50% to 60%.

In some embodiments, at least one opening 1121 is in the second part 112 of the light shield layer 110. Having at least one opening 1121 in the second part 112 may also reduce the adversary effect the light shielding layer have on the GOA signal line. Optionally, the ratio of the opening area of at least one opening 1121 to the area of the second part 112 is in a range of 0.5% to 60%, e.g. 0.5% to 10%, 10% to 20%, 20% to 30%, 30% to 40%, 40% to 50%, and 50% to 60%.

In another aspect, the present disclosure also provides a display panel including the display substrate described herein, and one or more integrated circuits connected to the display substrate. Optionally, the display panel is a liquid crystal display panel. Optionally, the display panel is an organic light emitting diode display panel.

In another aspect, the present disclosure also provides a display apparatus including the display panel described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

Figure 8A:
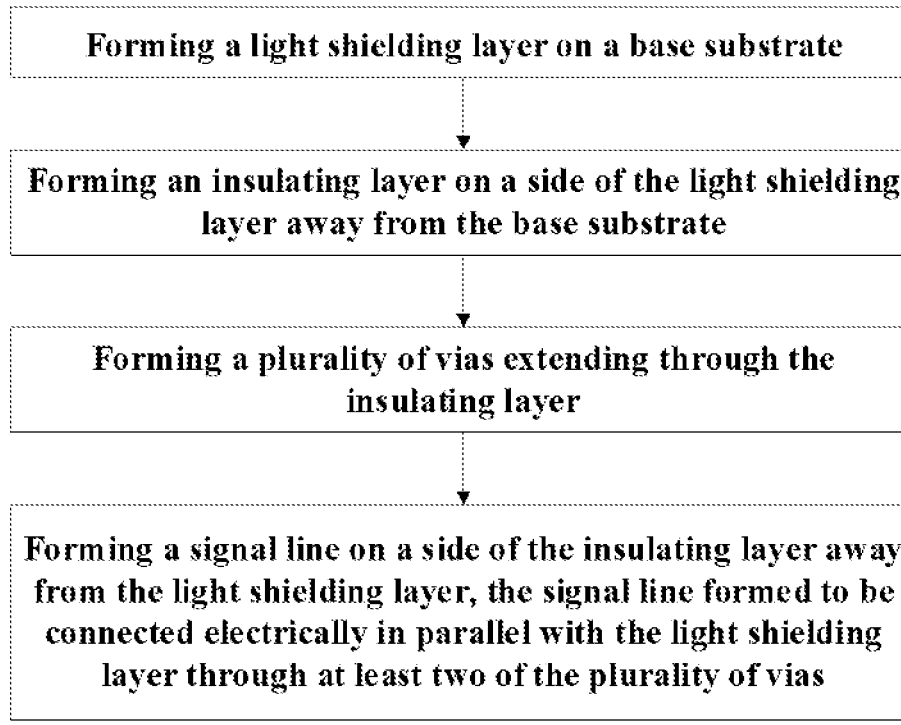
FIG. 8A is a flow chart illustrating a method of fabricating a display substrate in some embodiments according to present disclosure.

In another aspect, the present disclosure also provides a method of fabricating a display substrate having a display area and a gate-on-array (GOA) area outside the display area. FIG. 8A is a flow chart illustrating a method of fabricating a display substrate in some embodiments according to present disclosure. Referring to FIG. 8A, the method in some embodiments includes forming a light shielding layer on a base substrate; forming an insulating layer on a side of the light shielding layer away from the base substrate; forming a plurality of vias extending through the insulating layer; and forming a signal line on a side of the insulating layer away from the light shielding layer. Optionally, the signal line is formed to be connected electrically in parallel with the light shielding layer through at least two of the plurality of vias.

Optionally, the GOA signal line is electrically connected to the first part of the light shielding layer through the plurality of first vias respectively to connecting the GOA signal line and the first part of the light shielding layer electrically in parallel.

Various appropriate materials may be used for making the light shielding layer 110. Optionally, the light shielding layer 110 is made of a metal material. For example, the light shielding layer 110 is made of molybdenum. Optionally, the light shielding layer 110 is made of a light shielding material.

By forming a light shielding layer, and at least two vias of the plurality of vias extending through the insulating layer, the signal line is electrically connected in parallel with the light shielding layer through the at least two vias of the plurality of vias, and the resistance of a combination of the signal line and the light shielding layer is reduced.

In some embodiments, the light shielding layer include a first part. The plurality of vias include a plurality of first vias. The signal line is a GOA signal line. The GOA signal line is connected electrically in parallel with the first part of the light shielding layer through at least two vias of the plurality of first vias.

Figure 8B:
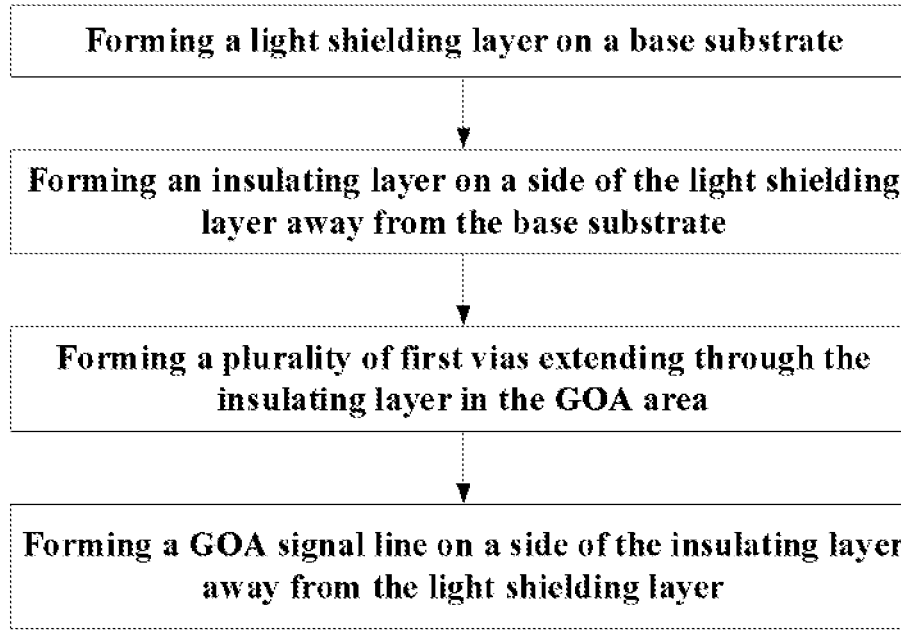
FIG. 8B is a flow chart illustrating a method of fabricating a display substrate some embodiments according to present disclosure.

FIG. 8B is a flow chart illustrating a method of fabricating a display substrate in some embodiments according to present disclosure. Referring to FIG. 8B, in some embodiments, the method includes forming a light shielding layer on a base substrate; forming an insulating layer on a side of the light shielding layer away from the base substrate; forming a GOA signal line on a side of the insulating layer away from the light shielding layer; and forming a plurality of first vias extending through the insulating layer in the GOA area. Optionally, the GOA signal line is formed to be connected electrically in parallel with a first prat of the light shielding layer. Optionally, the first part is in the GOA area.

In some embodiments, in the process of forming a light shielding layer on a base substrate, the light shielding layer further include a second part spaced apart from the first part. In the process of forming an insulating layer on a side of the light shielding layer away from the base substrate, the insulating layer includes a planarization layer on a side of the GOA signal line. Optionally, the planarization layer is in direct contact with the GOA signal line. In the process of forming a plurality of vias extending through the insulating layer, the plurality of vias include a plurality of second vias. In the process of forming a signal line on a side of the insulating layer away from the light shielding layer, the signal line is a first signal line on a side of the planarization layer away from the base substrate.

For example, the method further includes forming a planarization layer on a side of the GOA signal line away from the base substrate; forming a first signal line in the GOA area and on a side of the planarization layer away from the base substrate; and forming a plurality of second vias extending through the insulating layer and the planarization layer in the GOA area. Optionally, the first signal line is formed to be connected electrically in parallel with a second part of the light shielding layer in the GOA area, the second part spaced apart from the first part. Optionally, the first signal line is formed to be electrically connected to the second part of the light shielding layer through the plurality of second vias respectively to connect the first signal line and the second part of the light shielding layer electrically in parallel.

In some embodiments, in the process of forming a light shielding layer on a base substrate, the light shielding layer include a third part. The third part of the light shielding layer is spaced apart from the first part of the light shielding layer. The third part of the light shielding layer is spaced apart from the second part of the light shielding layer. In the process of forming a plurality of vias extending through the insulating layer, the plurality of vias include a plurality of third vias. In the process of forming a signal line on a side of the insulating layer away from the light shielding layer, the signal line is a second signal line on side of the planarization layer away from the base substrate.

For example, the method further includes forming a second signal line in the display area and on a side of the planarization layer away from the base substrate; and forming a plurality of third vias extending through the insulating layer and the planarization layer in the display area. Optionally, the second signal line is formed to be connected electrically in parallel with a third part of the light shielding layer in the display area. Optionally, the second signal line is formed to be electrically connected to the third part of the light shielding layer through the plurality of third vias respectively to connect the second signal line and the third part of the light shielding layer electrically in parallel.

In some embodiments, the method further includes forming a plurality of thin film transistors in the display area. Optionally, forming the light shielding layer further includes forming a plurality of light shielding blocks on the base substrate and in the display area. Optionally, a respective one of the plurality of light shielding blocks is formed on a side of an active layer of the plurality of thin film transistors closer to the base substrate for shielding light from irradiating on the active layer. Optionally, the first part of the light shielding layer and the plurality of light shielding blocks are formed in a same layer using a same material and a single mask plate.

In some embodiments, the first part, the second part, the third part, and the plurality of light shielding blocks of the light shielding, layer are formed in a same layer using a same material and a single mask plate.

Figure 9A:
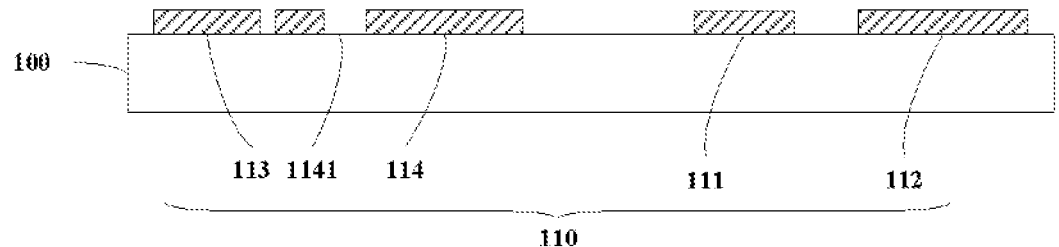
FIG. 9A to FIG. 9F are cross-sectional views of a display substrate illustrating a method of fabricating a display substrate in some embodiments according to present disclosure.
Figure 9B:
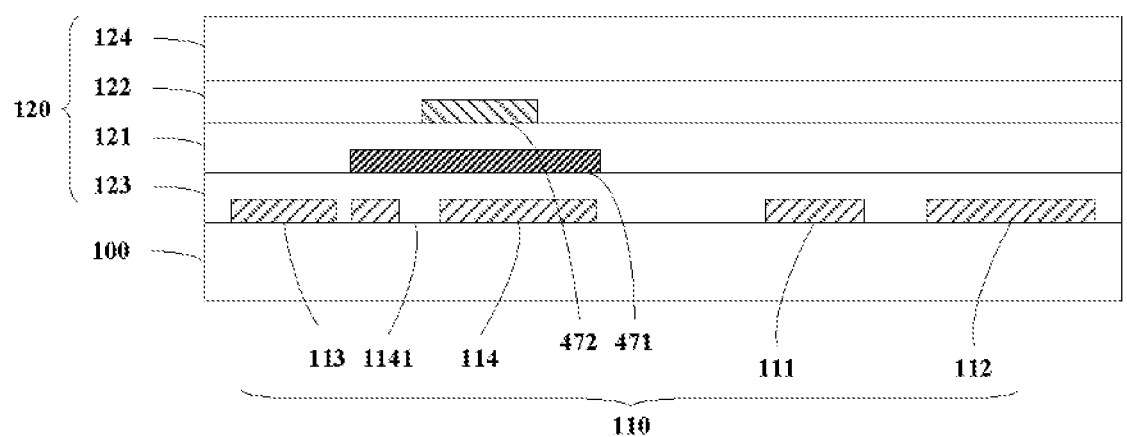
Figure 9C:
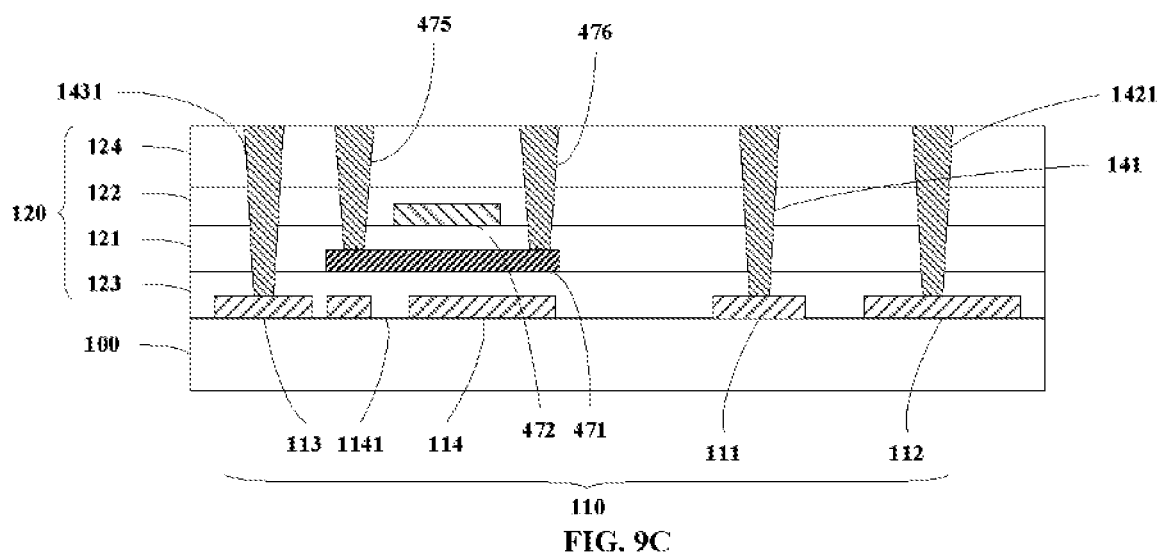
Figure 9D:
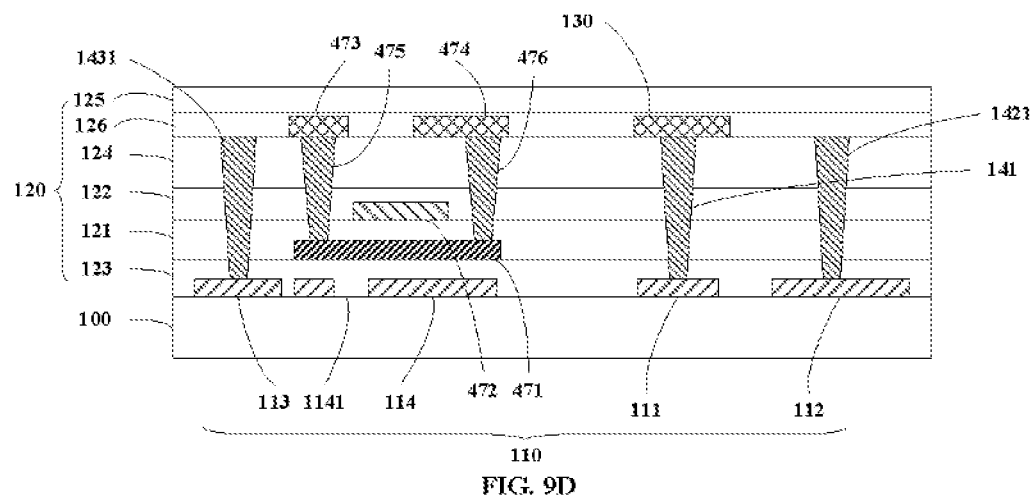
Figure 9E:
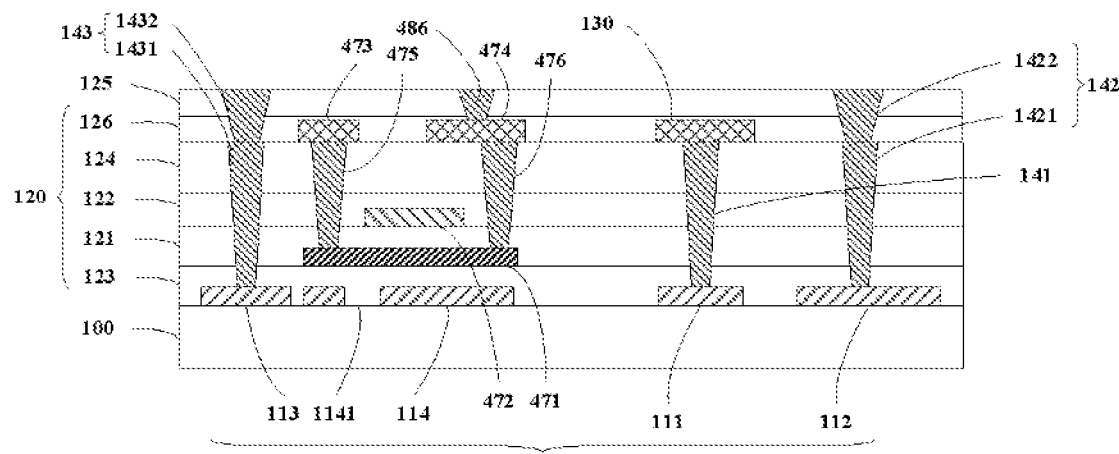
Figure 9F:
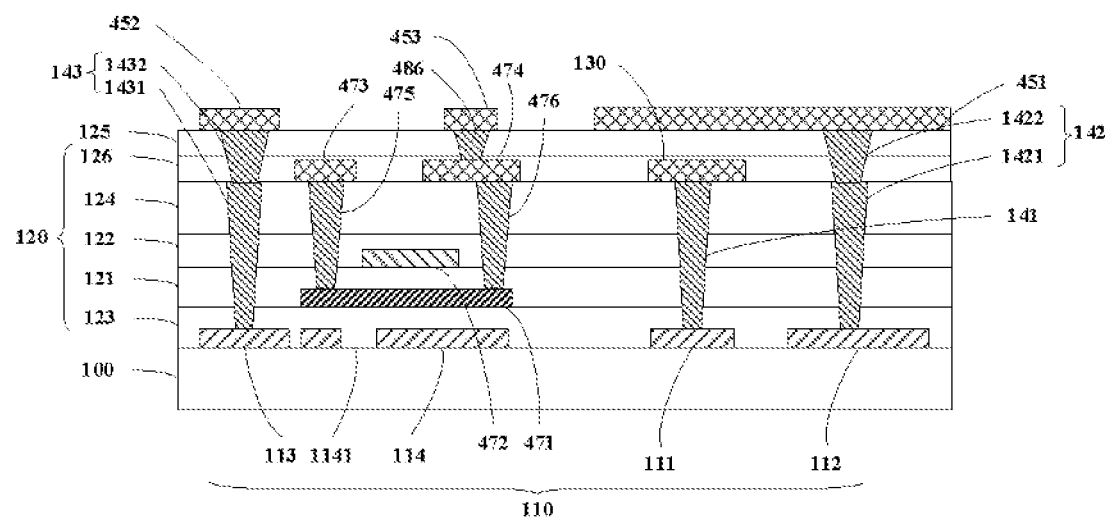

FIG. 9 to FIG. 9F are cross-sectional views of a display substrate illustrating a method of fabricating a display substrate in some embodiments according, to present disclosure.

Referring to FIG. 9A, in some embodiments, a light shielding layer 110 is formed on the base substrate 100. In one example, the base substrate is a flexible base substrate. In another example, the base substrate is a rigid base substrate. Optionally, the light shielding layer 110 includes a first part 111, a second part 112, a third part 113, and a plurality of light shielding blocks 114.

For example, the first part 111 of the light shielding layer 110 is formed to be connected electrically in parallel with a GOA signal line. The second part 112 of the light shielding layer 110 is formed to be connected electrically in parallel with a first signal line. The third part 113 of the light shielding layer is formed to be connected electrically in parallel with a second signal line. A respective one of the plurality of light shielding blocks 114 is formed to be electrically connected to a respective one of the plurality of thin film transistors. Optionally, one of the plurality of light shielding blocks 114 includes an opening allowing light passing through to a photosensor for fingerprint detection.

Referring to FIG. 9B, in some embodiments, a buffer layer 123 is formed on a side of the light shielding layer 110 away from the base substrate 100 using processes including deposition. Subsequently, an active layer 471 is formed on a side of the buffer layer 123 using, processes including Low Temperature Poly-silicon (LTPS). Subsequently, a first insulating layer 121 is formed on a side of the active layer 471 away from the base substrate using processes including deposition. Optionally, an orthographic projection of the first insulating layer 121 on the base substrate 100 covers an orthographic projection of the active layer 471 on the base substrate 100. Subsequently, a gate electrode 472 is formed on a side of the first insulating layer 121 away from the base substrate 100 using processes including deposition and patterning. Optionally, wherein an orthographic projection of the respective one of the plurality of light shielding blocks 114 on the base substrate covers an orthographic projection of the active layer 471 of the plurality of thin film transistors on the base substrate 100. Subsequently, a second insulating layer 122 is formed on a side of the gate electrode 472 away from the base substrate 100 using processes including deposition. Optionally, an orthographic projection of the second insulating layer 122 on the base substrate 100 covers the orthographic projection of the gate electrode 472 on the base substrate 100. Subsequently, an inter-layer dielectric layer 124 is formed on a side of the second insulating layer 122 away from the base substrate 100. By forming the buffer layer 123, the first insulating layer 121, the second insulating layer, and an inter-layer dielectric layer 124, the insulating layer 120 is formed.

Referring to FIG. 9C, in some embodiments, by using processes including photolithography, etching, and deposition, a plurality of first vias 141 are formed to extend through the insulating layer 120 and to expose a portion of the first part 111 of the light shielding layer 110; a plurality of fourth vias 475 are formed to extend through the insulating layer 120 and to expose a portion of the active layer 471; a plurality of fifth vias 476 are formed to extend through the insulating layer 120 and to expose a portion of the active layer 471; a first region 1421 of a respective one of the plurality of the second vias is formed to extend through the insulating layer 120 and to expose a portion of the second part 112 of the light shielding layer 110; and a second region 1431 of a respective one of the plurality of the third vias is formed to extending through the insulating layer 120 and to expose the third part 113 of the light shielding layer 110.

Referring to FIG. 9D, in some embodiments, a source electrode 473, a drain electrode 474, and a GOA signal line 130 is formed on a side of the inter-layer dielectric layer 124 using deposition and patterning. Optionally, the source electrode 473 is electrically connected to the active layer 471 through a respective one of the plurality of fourth vias 475. Optionally, the drain electrode 474 is electrically connected to the active layer 471 through a respective one of the plurality of fifth vias 476. Optionally, the GOA signal line 103 is electrically connected to the first part 111 of the light shielding layer 110 through the plurality of the first vias 141. For example, the GOA signal line 103 is connected electrically in parallel with the first part 111 of the light shielding layer 110 through at least two vias of the plurality of the first vias 141.

Subsequently, a planarization layer 125 is formed on side of the source electrode 473, the drain electrode 474, and the GOA signal line 130 away from the base substrate 100. Optionally, an orthographic projection of the planarization layer 125 on the base substrate 100 covers an orthographic projection of the source electrode 473, the drain electrode 474, and the GOA signal line 130. In some embodiments, the insulating layer 120 includes the buffer layer 123, the first insulating layer 121, the second insulating layer 122, the inter-layer dielectric layer 124, and the planarization layer 125.

In some embodiments, prior to forming the planarization layer 125, a passivation layer 126 is formed on a side of the source electrode 473, the drain electrode 474, and the GOA signal line 130 away from the base substrate 100. Subsequently, the planarization layer 125 is formed on a side of the passivation layer 126 away from the base substrate 100.

Referring to FIG. 9E, in some embodiments, a third region 1422 of a respective one of the plurality of the second vias 142, a fourth region 1432 of a respective one of the plurality of the third vias 143, and a respective one of the plurality of sixth vias 486 are formed to extending through the planarization layer 125, using the processes including photolithography, etching, and deposition. Optionally, the third region 1422 of a respective one of the plurality of the second vias 142, the fourth region 1432 of a respective one of the plurality of the third vias 143, and a respective one of the plurality of sixth vias 486 are formed to extending through the planarization layer 125 and the passivation layer 126. Optionally, the plurality of sixth vias 486 are formed to expose a portion of the drain electrode 474.

In one example, the third region 1422 of a respective one of the plurality of the second vias 142 is formed to be connected with the first region 1421 of the respective one of the plurality of the second vias 142 to form the respective one of the plurality of second vias 142. In another example, the fourth region 1432 of a respective one of the plurality of the third vias 143 is formed to be connected with the second region 1431 of the respective one of the plurality of the third vias 143 to form the respective one of the plurality of third vias 143.

In some embodiments, the plurality of second vias 142 can be formed subsequent to forming the planarization layer 125. For example, the plurality of second vias 142 is formed by etching the planarization layer 125, the inter-layer dielectric layer 124, the second insulating layer 122, the first insulating layer 121, and the buffer layer 123, to expose a portion of the second part 112 of the light shielding layer 110. Subsequently, a conductive material is filed into the plurality of second vias 142.

In some embodiments, the plurality of third vias 143 can be formed subsequent to forming the planarization layer 125. For example, the plurality of third vias 143 is formed by etching the planarization layer 125, the inter-layer dielectric layer 124, the second insulating layer 122, the first insulating layer 121, and the buffer layer 123, to expose a portion of the third part 113 of the light shielding layer 110. Subsequently, a conductive materials is filed into the plurality of third vias 143.

Referring to FIG. 9F, in some embodiments, a first signal line 451, a second signal line 452, a third signal line 453 are formed on a side of the planarization layer 125 away from the base substrate 100 using process including deposition and patterning. Optionally, the first signal line 451 is electrically connected to the second part 112 of the light shielding layer 110 through the plurality of second vias 142. For example, the first signal line 451 is connected electrically in parallel with the second part 112 of the light shielding layer 110 through at least two vias of the plurality of second vias 142. Optionally, the second signal line 452 is electrically connected to the third part 113 of the light shielding layer 110 through the plurality of third vias 143. For example, the second signal line 452 is connected electrically in parallel with the third part 113 of the light shielding layer 110 through, at least two vias the plurality of third vias 143. Optionally, the third signal line 453 is electrically connected to the drain electrode 474 through a respective one of the plurality of sixth vias 486.

By electrically connecting the GOA signal line 130 in parallel with the first part 111 of the light shielding layer 110, a resistance of a combination of the GOA signal line 130 and the first part 111 of the light shielding, layer 110 is lower than a sum of the resistance of the GOA signal line 130 and the resistance of the first part 111 of the light shielding layer 110. By electrically connecting the first signal line 451 in parallel with the second part 112 of the light shielding, layer 110, a resistance of a combination of the first signal line 451 and the second part 112 of the light shielding layer 110 is lower than a sum of the resistance of the first signal line 451 and the resistance of the second part 112 of the light shielding layer 110. By electrically connecting the second signal line 452 in parallel with the third part 113 of the light shielding layer 110, a resistance of a combination of the second signal line 452 and the third part 113 of the light shielding, layer 110 is lower than a sum of the resistance of the second signal line 452 and the resistance of the third part 113 of the light shielding layer 110. A lower resistance may improve the display uniformity.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a display area and a gate-on-array (GOA) area outside the display area, comprising:
   a base substrate;
   a light shielding layer on the base substrate;
   an insulating layer on a side of the light shielding layer away from the base substrate;
   a GOA signal line on a side of the insulating layer away from the light shielding layer, and is connected electrically in parallel with a first part of the light shielding layer, the first part being in the GOA area;
   a plurality of thin film transistors in the display area;
   a planarization layer on a side of the GOA signal line away from the base substrate;
   a first signal line in the GOA area and on a side of the planarization layer away from the base substrate, and is connected electrically in parallel with a second part of the light shielding layer in the GOA area, the second part spaced apart from the first part;
   a second signal line in the display area and on a side of the planarization layer away from the base substrate, and is connected electrically in parallel with a third part of the light shielding layer in the display area, the third part spaced apart from the first part and spaced apart from the second part; and
   a plurality of third vias extending through the insulating layer and the planarization layer in the display area;
   wherein the display substrate comprises a plurality of first vias extending through the insulating layer in the GOA area; and
   the GOA signal line is electrically connected to the first part of the light shielding layer through the plurality of first vias respectively, thereby connecting the GOA signal line and the first part of the light shielding layer electrically in parallel;
   the light shielding layer further comprises a plurality of light shielding blocks on the base substrate and in the display area, a respective one of the plurality of light shielding blocks on a side of an active layer of the plurality of thin film transistors closer to the base substrate for shielding light from irradiating on the active layer;
   the first part of the light shielding layer and the plurality of light shielding blocks are in a same layer and comprise a same material;
   the display substrate comprises a plurality of second vias extending through the insulating layer and the planarization layer in the GOA area;
   the first signal line is electrically connected to the second part of the light shielding layer through the plurality of second vias respectively, thereby connecting the first signal line and the second part of the light shielding layer electrically in parallel; and
   the second signal line is electrically connected to the third part of the light shielding layer through the plurality of third vias respectively, thereby connecting the second signal line and the third part of the light shielding layer electrically in parallel.

2. The display substrate of claim 1, comprising at least one opening in the second part of the light shielding layer.

3. The display substrate of claim 1, wherein the first part and the second part of the light shielding layer, and the plurality of light shielding blocks are in a same layer and comprise a same material.

4. The display substrate of claim 1, wherein the first part, the second part, and the third part of the light shielding layer, and the plurality of light shielding blocks are in a same layer and comprise a same material.

5. The display substrate of claim 1, wherein an orthographic projection of the respective one of the plurality of light shielding blocks on the base substrate covers an orthographic projection of the active layer of the plurality of thin film transistors on the base substrate.

6. The display substrate of claim 1, further comprising an opening in the respective one of the plurality of light shielding blocks allowing light passing through to a photosensor for fingerprint detection.

7. The display substrate of claim 1, wherein the GOA signal line is selected from a group consisting of a clock signal line, a high voltage power line, and a low voltage power line.

8. The display substrate of claim 1, wherein the first signal line is a power signal line.

9. The display substrate of claim 1, wherein the second signal line is a ground voltage line.

10. The display substrate of claim 1, comprising at least one opening in the first part of the light shielding layer.

11. A display panel, comprising the display substrate of claim 1, and one or more integrated circuits connected to the display substrate.

12. A display apparatus, comprising the display panel of claim 11.

13. A method of fabricating a display substrate having a display area and a gate-on-array (GOA) area outside the display area, comprising:
- forming a light shielding layer on a base substrate;
- forming an insulating layer on a side of the light shielding layer away from the base substrate;
- forming a GOA signal line on a side of the insulating layer away from the light shielding layer, the GOA signal line formed to be connected electrically in parallel with a first part of the light shielding layer, the first part being in the GOA area;
- forming a plurality of first vias extending through the insulating layer in the GOA area;
- forming a plurality of thin film transistors in the display area;
- forming a planarization layer on a side of the GOA signal line away from the base substrate;
- forming a first signal line in the GOA area and on a side of the planarization layer away from the base substrate, the first signal line formed to be connected electrically in parallel with a second part of the light shielding layer in the GOA area, the second part spaced apart from the first part;
- forming a plurality of second vias extending through the insulating layer and the planarization layer in the GOA area;
- forming a second signal line in the display area and on a side of the planarization layer away from the base substrate, the second signal line formed to be connected electrically in parallel with a third part of the light shielding layer in the display area, the third part spaced apart from the first part and spaced apart from the second part; and
- forming a plurality of third vias extending through the insulating layer and the planarization layer in the display area;

wherein the GOA signal line is electrically connected to the first part of the light shielding layer through the plurality of first vias respectively, thereby connecting the GOA signal line and the first part of the light shielding layer electrically in parallel;

forming the light shielding layer further comprises forming a plurality of light shielding blocks on the base substrate and in the display area, a respective one of the plurality of light shielding blocks formed on a side of an active layer of the plurality of thin film transistors closer to the base substrate for shielding light from irradiating on the active layer;

the first part of the light shielding layer and the plurality of light shielding blocks are formed in a same layer using a same material and a single mask plate;

the first signal line is formed to be electrically connected to the second part of the light shielding layer through the plurality of second vias respectively, thereby connecting the first signal line and the second part of the light shielding layer electrically in parallel; and the second signal line is formed to be electrically connected to the third part of the light shielding layer through the plurality of third vias respectively, thereby connecting the second signal line and the third part of the light shielding layer electrically in parallel.

14. The method of claim 13, wherein the first part, the second part, and the third part of the light shielding layer, and the plurality of light shielding blocks are formed in a same layer using a same material and a single mask plate.

* * * * *